(12) United States Patent
Beck

(10) Patent No.: US 9,722,565 B2
(45) Date of Patent: Aug. 1, 2017

(54) FILTER COMPONENT

(71) Applicant: EPCOS AG, Munich (DE)

(72) Inventor: Fabian Beck, Rüttenen (CH)

(73) Assignee: EPCOS AG, Munich (DE)

( * ) Notice: Subject to any disclaimer, the term of this patent is extended or adjusted under 35 U.S.C. 154(b) by 119 days.

(21) Appl. No.: 14/765,784

(22) PCT Filed: Feb. 3, 2014

(86) PCT No.: PCT/EP2014/052055
§ 371 (c)(1),
(2) Date: Aug. 4, 2015

(87) PCT Pub. No.: WO2014/122095
PCT Pub. Date: Aug. 14, 2014

(65) Prior Publication Data
US 2015/0372655 A1    Dec. 24, 2015

(30) Foreign Application Priority Data
Feb. 11, 2013  (DE) .......... 10 2013 101 323

(51) Int. Cl.
*H03H 7/01*     (2006.01)
*H02G 5/04*     (2006.01)
(Continued)

(52) U.S. Cl.
CPC ......... *H03H 7/0138* (2013.01); *B60L 3/0023* (2013.01); *B60L 11/18* (2013.01);
(Continued)

(58) Field of Classification Search
CPC .. H03H 7/0138; H03H 7/0115; H03H 1/0007; H03H 7/427; H02G 5/00; H02G 5/04
(Continued)

(56) References Cited

U.S. PATENT DOCUMENTS

| 8,063,728 B2 | 11/2011 | Brunel et al. | |
| 2008/0143285 A1* | 6/2008 | Lucas | H02M 1/44 |
| | | | 318/400.24 |
| 2009/0015992 A1 | 1/2009 | Nohara et al. | |

FOREIGN PATENT DOCUMENTS

| DE | 4311126 A1 | 10/1994 |
| DE | 102005013509 A1 | 10/2005 |

(Continued)

OTHER PUBLICATIONS

"DC EMC/EMI Filter for PV Inverters," Schaffner—Energy Efficiency and Reliability, DC Filters, FN 2200, Feb. 2012, 4 pages.
(Continued)

*Primary Examiner* — Stephen E Jones
*Assistant Examiner* — Rakesh Patel
(74) *Attorney, Agent, or Firm* — Slater Matsil, LLP

(57) ABSTRACT

A filter component includes a housing body. A first and at least one second busbar each have a first end section, and a second end section, between which in each case a center section is arranged. The end sections of the busbars each have connections for connecting electrical conductors to the filter component. The first and second end section and the center section of the first busbar are arranged in a first plane and the first and second end section and the center section of the at least one second busbar are arranged in a second plane, which is different from the first plane.

17 Claims, 3 Drawing Sheets

(51) Int. Cl.
*H03H 1/00* (2006.01)
*B60L 3/00* (2006.01)
*B60L 11/18* (2006.01)
*H01F 27/24* (2006.01)
*H01F 38/14* (2006.01)
*H02M 7/00* (2006.01)
*H01F 17/06* (2006.01)

(52) U.S. Cl.
CPC ............ *H01F 27/24* (2013.01); *H01F 38/14* (2013.01); *H02G 5/04* (2013.01); *H03H 1/0007* (2013.01); *H03H 7/0115* (2013.01); *B60L 2270/147* (2013.01); *H01F 2017/065* (2013.01); *H01F 2038/146* (2013.01); *H02M 7/003* (2013.01); *H03H 2001/0035* (2013.01); *Y02T 10/7005* (2013.01)

(58) Field of Classification Search
USPC ..... 333/4, 5, 181, 185; 174/72 B, 99 B, 68.2
See application file for complete search history.

(56) References Cited

FOREIGN PATENT DOCUMENTS

| | | |
|---|---|---|
| DE | 102004039230 A1 | 2/2006 |
| DE | 102007048276 A1 | 4/2009 |
| JP | H01105409 A | 4/1989 |
| JP | H0346224 A | 2/1991 |
| JP | H08336226 A | 12/1996 |
| JP | 2005080337 A | 3/2005 |
| JP | 2006024772 A | 1/2006 |
| JP | 2007226639 A | 9/2007 |
| JP | 2014500650 A | 1/2014 |
| WO | 2007094162 A1 | 8/2007 |
| WO | 2012059132 A1 | 5/2012 |

OTHER PUBLICATIONS

"EMC Filters; 2-line filters; SIFI-G for enhanced insertion loss; Rated current 3 to 36 A," EPCOS AG, B84112G, Jan. 2006, 9 pages.

* cited by examiner

FILTER COMPONENT

This patent application is a national phase filing under section 371 of PCT/EP2014/052055, filed Feb. 3, 2014, which claims the priority of German patent application 10 2013 101 323.6, filed Feb. 11, 2013, each of which is incorporated herein by reference in its entirety.

TECHNICAL FIELD

The present invention relates to a filter component, in particular to an EMC filter.

BACKGROUND

In the automotive sector, for example, in the case of hybrid and electric vehicles, long connections of a high-voltage bus between a high-voltage battery and a drive unit are to be made. The drive unit may usually generate a disturbance voltage of 120 dBµV at 150 kHz on the connection line. In the future, it is proposed that the high-voltage bus has an open architecture, with the result that a multiplicity of components in the vehicle, for example, AC voltage generators, pumps, etc., can access the common high-voltage bus. Therefore, it is necessary to make the connections between the high-voltage battery and the drive unit by elaborately shielded connectors and lines.

SUMMARY

Embodiments of the invention provide a filter component which enables disturbance voltages on an electrical line to be sufficiently suppressed, has a low requirement on space and is as simple to assemble as possible.

According to a possible embodiment, a filter component comprises a housing body and at least two busbars, which each have a first end section and a second end section, between which in each case a center section is arranged. A first one of the busbars has a first connection for connecting a first potential and a second connection for connecting a first load. At least one second one of the busbars has a first connection for connecting a second potential, which is different from the first potential, and a second connection for connecting a second load, which is different from the first load, or for connecting a reference potential. The respective first connection is arranged in the respective first end section and the respective second connection is arranged in the respective second end section of the at least two busbars. The respective first end section of the at least two busbars projects out of the housing body on a first side of the housing body. The respective second end section of the at least two busbars projects out of the housing body on a second side of the housing body, which is different from the first side. The respective center section of the at least two busbars is arranged in the housing body. The first end section, the second end section and the center section of the first busbar are arranged in a first plane. The first end section, the second end section and the center section of the at least one second busbar are arranged in a second plane, which is different from the first plane.

The filter component can be used as an EMC filter. Since the end sections with the connections for each busbar are in the same plane and the two busbars are arranged in different planes, the mounting of the connections of the filter component to continuing conductors can be done from a mounting direction. If the end sections of the first and the at least one second busbar in the respective plane are arranged in different directions, all of the connections are easily accessible from a mounting direction in order, for example, to perform a screw-connection to the continuing conductor. The first and the at least one second busbar can be bent into an L shape for this purpose. The L-shaped geometry of the busbars has the further advantage that, for example, when stamping out the busbars from a metal sheet, there is only a low material consumption.

BRIEF DESCRIPTION OF THE DRAWINGS

The invention is explained in more detail below on the basis of figures which show embodiments of the present invention. In the figures.

DETAILED DESCRIPTION OF ILLUSTRATIVE EMBODIMENTS

Figure 1:
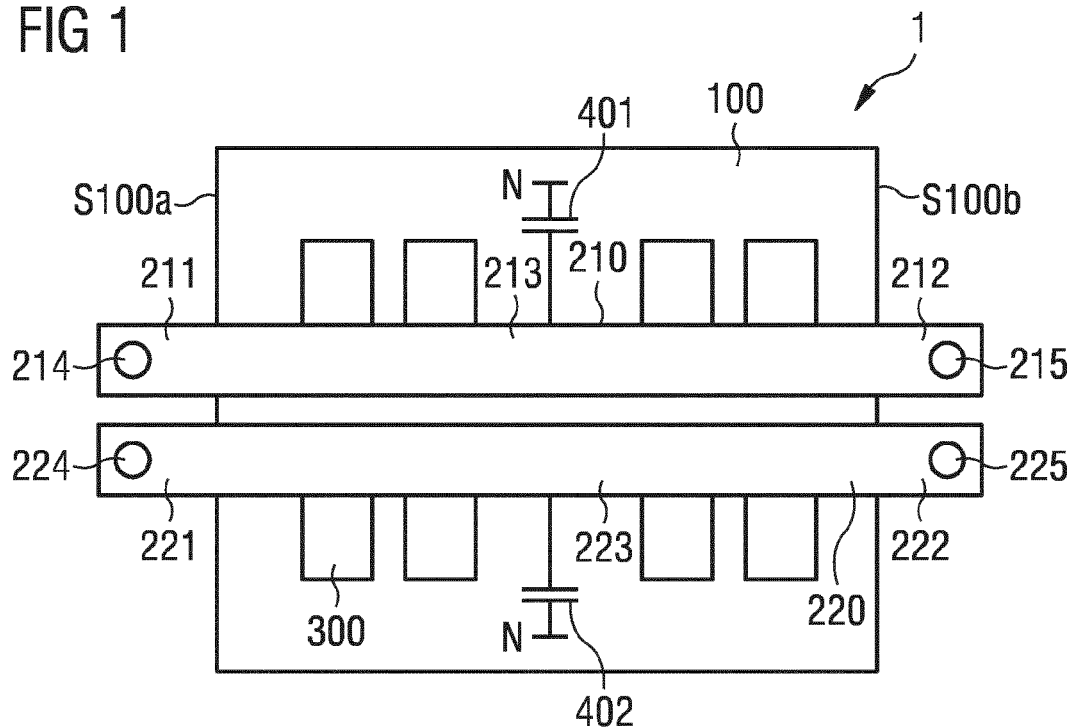
FIG. 1 shows an embodiment of a filter component for filtering a disturbance voltage on an electrical line.

FIG. 1 shows a plan view of an embodiment of a filter component 1, in particular an EMC filter component, for filtering a disturbance signal which can be transmitted along with a useful signal on an electrical line. The filter component has a housing body 100 in which a busbar 210 and a busbar 220 are arranged. The busbars 210 and 220 can each be designed as flat conductors. The busbar 210 has an end section 211 which projects out of the housing on a side S100a of the housing body. Another end section 212 of the busbar 210 projects out of an opposite side S100b of the housing body. A center section 213 of the busbar 210 is arranged inside the housing. The busbar 220 has an end section 221 which projects out of the side S100a of the housing 100. Another end section 222 of the busbar 220 projects out of a side S100b of the housing body 100. A center section 223 of the busbar 220 runs inside the housing.

In order to connect the filter component 1 to electrical conductors, the busbar 210 has a connection 214 and a connection 215. The connection 214 is arranged at the end section 211 of the busbar 210. The connection 215 is arranged at the end section 212 of the busbar 210. By means of the connection 214, the busbar 210 can be connected, for example, to a supply voltage, for example, to a battery. The connection 215 can be connected to a load or to a consumer. The busbar 220 has a connection 224 for connection to electrical conductors, which connection 224 is arranged at the end section 221 of the busbar 220, and a connection 225, which is arranged at the end section 222 of the busbar 220.

The center sections 213 and 223 of the busbars 210 and 220 are surrounded by magnetic cores 300 inside the housing body 100. In the exemplary embodiment of FIG. 1, by way of example, four annular magnetic cores are arranged inside the housing body 100, which annular magnetic cores surround the respective center sections 213, 223 of the busbars 210 and 220. The busbar 210 can be connected via a capacitor 401 to a reference voltage connection N, for example, a ground connection. The busbar 220 can be connected via a capacitor 402 to the reference voltage connection N.

Figure 2:
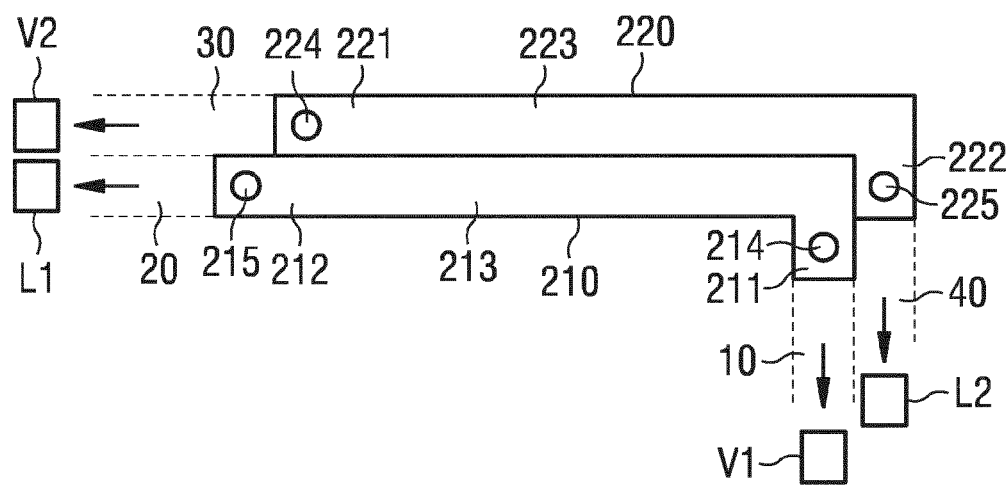
FIG. 2 shows an embodiment of at least two busbars for a filter component for filtering a disturbance voltage on an electrical line.

In the embodiment of a filter component shown in FIG. 1, the busbars 210 and 220 are designed as rectilinear flat conductors. FIG. 2 shows an embodiment of busbars 210, 220 which are likewise designed as flat conductors but which, in contrast to the embodiment of the busbars shown in FIG. 1, are not designed to be rectilinear but L-shaped. Depending on the current load capacity thereof, the busbars 210 and 220 can have, for example, a length of between 10 cm and 1 m, a width of between 10 mm and 10 cm and a height/thickness of between 1 mm and 20 mm.

The busbar 210 has an end section 211 with a connection 214 for connecting an electrical conductor 10. The connection 214 can be connected via the electrical conductor 10 to a voltage potential V1, for example, the potential of a supply voltage. Furthermore, the busbar 210 has an end section 212 with a connection 215 for connecting an electrical load L1. The connection 215 can be connected via an electrical conductor 20 to the electrical load L1. A center section 213 of the busbar 210 is arranged between the two end sections 211 and 212.

The end section 211 is designed to be shorter than the remaining part of the busbar 210 composed of the center section 213 and the end section 212. The end section 211, the end section 212 and the center section 213 of the busbar 210 are arranged in a common plane. Instead of the rectilinear design, the end section 211 is arranged at an angle of between 80° and 100° with respect to the center section 213. In the embodiment shown in FIG. 2, the end section 211 is arranged at right angles to or at an angle of 90° with respect to the center section 213.

The busbar 220 is constructed in a similar manner to the busbar 210. It comprises an end section 221 with a connection 224 for connecting to a voltage potential, for example, for connecting to a supply voltage V2, and an end section 222 with a connection 225 for connecting to a load L2. By way of example, an electrical conductor 30 which connects the connection 224 to the voltage potential V2 can be connected to the connection 224. An electrical conductor 40 which connects the connection 225 to the load L2 can be connected to the connection 225. A center section 223 of the busbar 220 is arranged between the end sections 221 and 222.

In the case of the busbar 220, the end section 222 is designed to be shorter than the remaining part of the busbar 220 composed of the center section 223 and the end section 221. The end section 221, the center section 223 and the end section 222 are arranged in a common plane. Instead of the rectilinear design, the end section 222 is arranged at an angle of between 80° and 100° with respect to the center section 223. In the embodiment shown in FIG. 2, the end section 222 is arranged at right angles to or at an angle of 90° with respect to the center section 223.

Figure 3:
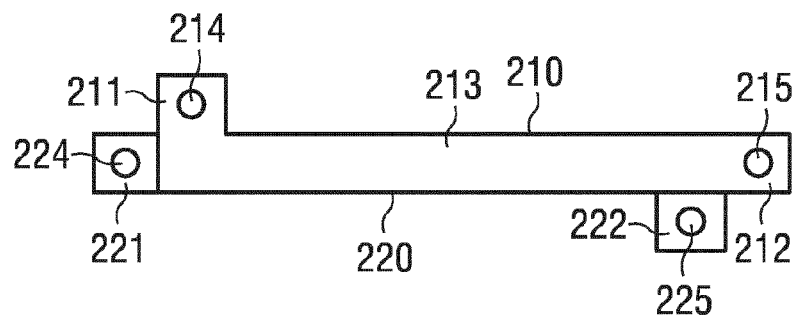
FIG. 3 shows an arrangement of an embodiment of at least two busbars for a filter component for filtering a disturbance voltage on an electrical line.

FIG. 3 shows an arrangement of the L-shaped busbars 210 and 220 shown in FIG. 2. The two busbars 210 and 220 are stacked one above the other in a stack arrangement. The two busbars are arranged in the stack arrangement such that the end section 211 of the busbar 210 and the end section 221 of the busbar 220 are arranged at one end of the stack arrangement. Correspondingly, in the stack arrangement, the end section 212 of the busbar 210 and the end section 222 of the busbar 220 are arranged at the other end of the arrangement. Owing to the shaping of the end sections 211 and 221, the connection 214 of the busbar 210 and the connection 224 of the busbar 220 are not oriented so as to align with one another. Likewise, owing to the shaping of the end sections 212 and 222, the connections 215 and 225 are not oriented so as to align with one another.

Figure 4A:
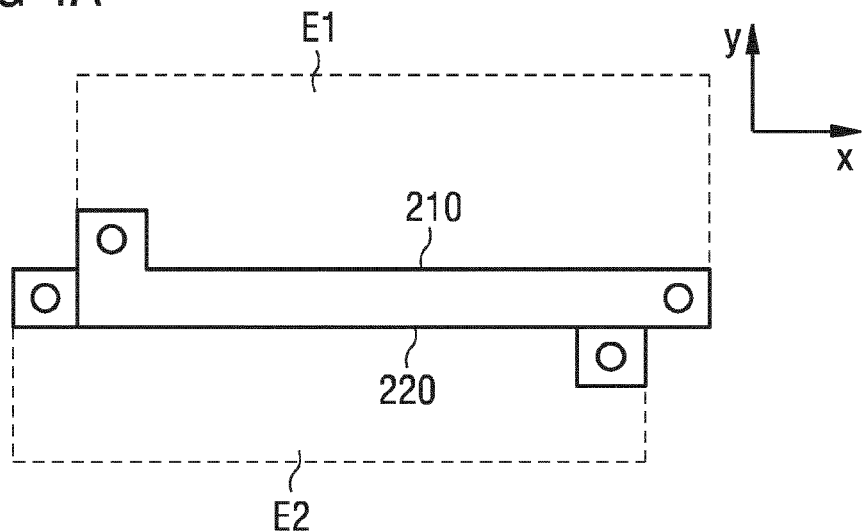
FIG. 4A shows a plan view of an arrangement of at least two busbars for a filter component for filtering a disturbance voltage on an electrical line.

FIG. 4A shows that, in the case of the arrangement of the busbar 210 shown in FIG. 3, the end sections 211, 212 and the center section 213 of the busbar 210 are arranged in a common plane E1. The plane E1 extends in an x-direction and a y-direction. In the case of the busbar 210, the end section 211 is oriented in a different direction from the center section 213 in the plane E1. The end section 212 of the busbar 210 is oriented in the same direction as the center section 213 in the plane E1.

In the case of the busbar 220, the end sections 221, 222 and the center section 223 are arranged in a common plane E2. The plane E2, like the plane E1, extends in an x-direction and a y-direction. The plane E1, in which the busbar 210 is arranged, and the plane E2, in which the busbar 220 is arranged, are arranged in a manner offset with respect to one another. In the case of the busbar 220, the end section 222 is oriented in a different direction from the center section 223 in the plane E2. The end section 221 of the busbar 220 is oriented in the same direction as the center section 223 in the plane E2. As a result, the connections 214 and 224 located in the end sections 211 and 221 and the connections 215 and 225 located in the end sections 212 and 222 are not oriented so as to align with one another.

Figure 4B:
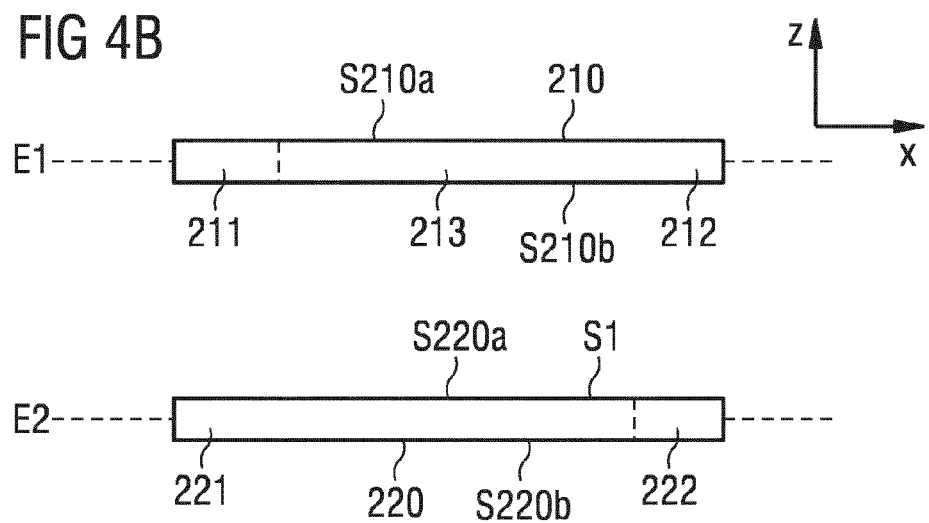
FIG. 4B shows a transverse view of an arrangement of at least two busbars for a filter component for filtering a disturbance voltage on an electrical line.

FIG. 4B shows a transverse view of the busbar 210 which is designed as flat conductor and the busbar 220 which is designed as flat conductor. The busbar 210 has a lateral surface S210a and a lateral surface S210b, wherein said two lateral surfaces have the largest area of all the lateral surfaces of the flat conductor owing to the geometry of the flat conductor. Likewise, the busbar 220 which is designed as flat conductor has a lateral surface S220a and a lateral surface S220b. The two lateral surfaces S220a and S220b have the largest area of all the lateral surfaces of the flat conductor 220. The plane E1 is arranged between the lateral surfaces S210a and S210b parallel to the lateral surfaces S210a and S210b. The plane E2 is arranged between the lateral surfaces S220a and S220b parallel to the lateral surfaces S220a and S220b. It is clear from FIG. 4B that the planes E1 and E2, in which the two busbars 210 and 220 are arranged, are arranged in a manner offset with respect to one another.

Figure 5:
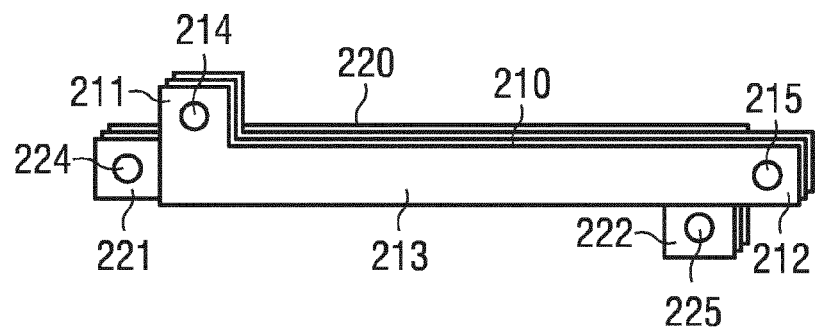
FIG. 5 shows another embodiment of at least two busbars for a filter component for filtering a disturbance voltage on an electrical line.

FIG. 5 shows an embodiment of busbars 210 and 220 of a filter component, wherein each of the busbars comprises a plurality of electrical conductors. The electrical conductors can be designed as flat conductors. The busbar 210 has the individual electrical conductors 210a and 210b, for example, which are arranged in a manner stacked one on top of the other. The busbar 220 has the electrical conductors 220a and 220b, which are likewise arranged in a stack arrangement one on top of the other.

The conductors 210a and 210b each have end sections 211 and 212 with connections 214 and 215. A center section 213 of the conductors 210a, 210b is arranged between the respective end sections 211 and 212. The electrical conductors 220a and 220b each have end sections 221 and 222 with connections 224 and 225. A center section 223 of the conductors 220a, 220b is arranged between the respective end sections 221 and 222.

In the case of the busbar 210, the electrical conductors 210a and 210b are arranged in a manner stacked one on top of the other such that the respective end sections 211 of the electrical conductors 210a, 210b are arranged one on top of the other. Likewise, the respective end sections 212 of the conductors 210a, 210b and the respective center sections 213 of the conductors 210a, 210b are arranged one on top of the other. In this case, the individual sections can be arranged one on top of the other in a congruent manner, as shown in FIG. 5. Thus, the respective connections 214 and 215 of the electrical conductors 210a, 210b are also arranged one on top of the other in a congruent manner.

In the case of the busbar 220, the electrical conductors 220a and 220b are arranged in a manner stacked one on top of the other such that the respective end sections 221 of the conductors 220a, 220b are arranged one on top of the other. Likewise, the respective end sections 222 of the conductors 220a, 220b and the respective center sections 223 of the conductors 220a, 220b are arranged one on top of the other. In the case of the busbar 220, too, the individual sections can be arranged one on top of the other in a congruent manner, as shown in FIG. 5. In this case, the respective connections 224 and 225 of the electrical conductors 220a, 220b are also arranged one on top of the other in a congruent manner.

Figure 6:
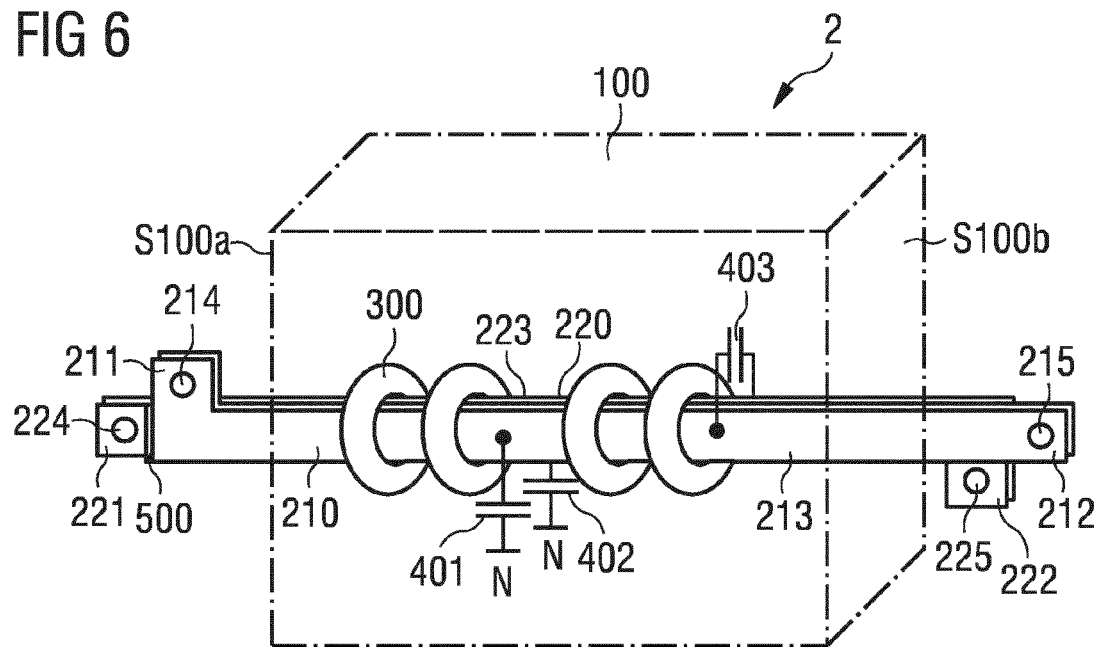
FIG. 6 shows an embodiment of a filter component for filtering a disturbance voltage on an electrical line.

FIG. 6 shows an embodiment of a filter component 2 which is designed as an EMC filter component for filtering a disturbance signal which can be transmitted along with a useful signal on an electrical line. The filter component 2 has a housing body 100 in which a busbar 210 and a busbar 220 are arranged. The busbars 210 and 220 can have the embodiments illustrated in FIGS. 2, 3, 4A, 4B and 5.

The busbars 210 and 220 can each be designed as flat conductors. In the case of the embodiment of the filter component shown in FIG. 6, the busbars 210 and 220 have a plurality of stacked electrical conductors, as shown in FIG. 5. Each of the busbars can also have in each case only one electrical conductor, as shown in FIG. 3. The busbars are arranged on the housing body such that the end section 211 projects out of the housing on a side S100a of the housing body. The end section 212 projects out of the housing body 100 on an opposite side S100b. A center section 213 of the busbar 210 is arranged inside the housing. In the case of the busbar 220, the end section 221 projects out of the housing body on the side S100a of the housing 100. The end section 222 of the busbar 220 projects out of the housing body 100 on the side S100b. A center section 223 of the busbar 220 runs inside the housing. In order to insulate the busbars with respect to one another, an insulator 500 can be arranged between the busbars 210 and 220.

In order to connect the filter component 1 to electrical conductors, the busbar 210 has the connection 214 and the connection 215. The connection 214 is arranged at the end section 211 of the busbar 210. The connection 215 is arranged at the end section 212 of the busbar 210. The busbar 210 can be connected, for example, to a supply voltage, for example, a battery, by means of the connection 214. The connection 215 can be connected to a load or to a consumer. In order to connect to electrical conductors, the busbar 220 has the connection 224, which is arranged at the end section 221 of the busbar 220, and the connection 225, which is arranged at the end section 222 of the busbar 220.

The center sections 213 and 223 of the busbars 210 and 220 are surrounded by at least one magnetic core 300 inside the housing body 100. By way of example, in the exemplary embodiment of FIG. 6, four annular magnetic cores, which surround the respective center sections 213, 223 of the busbars 210 and 220, are arranged inside the housing body 100. The filter component can have at least two capacitors.

The busbars 210 and 220 are each connected to a reference voltage connection N, for example, a ground connection, via one of said capacitors. The busbar 210 can be connected to the reference voltage connection N via a capacitor 401. The busbar 220 can be connected to the reference voltage connection N via a capacitor 402. Alternatively or in addition, the two busbars can be connected to one another via at least one capacitor. In the case of this symmetrical embodiment of the filter component, a capacitor 403 can be connected between the busbar 210 and the busbar 220.

The end section 211, the end section 212 and the center section 213 of the busbar 210 are arranged in a plane E1. The end section 221, the end section 222 and the center section 223 of the busbar 220 are arranged in a plane E2, which is different from the plane E1. In contrast to the embodiment 1, shown in FIG. 1, of a filter component, the busbars 210 and 220 are thus not arranged in a common plane. Instead, the busbars 210 and 220, as explained with reference to FIGS. 3, 4A and 4B, are arranged in different planes E1 and E2. As a result, the at least one magnetic core 300 can be designed to be smaller than in the case of the variant of a filter component shown in FIG. 1 and is therefore significantly more efficient than in the case of the embodiment shown in FIG. 1.

The connections 214, 215, 224 and 225 can each be designed as a fastening device for fastening the electrical conductors 10, 20, 30 and 40. By way of example, they can each be designed as a depression or as a screw thread to which the continuing electrical conductors can be screwed in the respective end sections of the busbars 210 and 220.

Since the connections 214, 215 are included in the end sections 211, 212 of the busbar 210, the two connections are present in the same plane E1. Likewise, the connections 224, 225 of the busbar 220 included in the end sections 221 and 222 are also arranged in the same plane E2. Since, as explained with reference to FIGS. 3, 4A and 4B, the two planes E1 and E2 run parallel to one another, the connections 214, 215, 224, 225 are also oriented in one direction. As a result, it is made possible to connect the electrical conductors, which are to be connected to the connections 214, 215, 224 and 225, to the busbars 210 and 220 from one direction with respect to the housing body or with respect to a substrate to which the housing body is fastened. Since the end sections, which are arranged on a common side of the housing body, of the busbars 210 and 220 are arranged in different directions in their respective plane, the connections do not overlap and are therefore easily accessible from a mounting direction. When the electrical connections are configured as screw threads, the filter component 2 can therefore be screw-connected to the continuing electrical conductors from a mounting direction.

Owing to the L-shaped geometry of the busbars 210 and 220, the electrical conductors can be mounted on the busbars from a mounting direction without it being necessary to rotate, bend apart or flatten the various sections of the busbars. Furthermore, there is only a low material consumption in the manufacture of the busbars, in particular when the busbars are stamped out of a metal sheet, owing to the L-shaped geometry of the busbars. The mounting of the filter component is facilitated owing to the L-shaped geometry of the busbars since the busbars can be pushed into the arrangement composed of the at least one annular core from the side.

The invention claimed is:

1. A filter component comprising:
a housing body;
a first busbar having a first end section and a second end section, and a center section between the first end section and the second end section; and
a second busbar having a first end section and a second end section, and a center section between the first end section and the second end section,
wherein the first busbar has a first connection for connecting to a first potential and a second connection for connecting to a first load,
wherein the second busbar has a first connection for connecting to a second potential, which is different from the first potential, and a second connection for connecting to a second load, which is different from the first load, or for connecting to a reference potential,
wherein the first connection of the first busbar is arranged in the first end section of the first busbar and the second connection of the first busbar is arranged in the second end section of the first busbar,
wherein the first connection of the second busbar is arranged in the first end section of the second busbar and the second connection of the second busbar is arranged in the second end section of the second busbar,
wherein the first end section of the first busbar projects out of the housing body on a first side of the housing body, the second end section of the first busbar projects out of the housing body on a second side of the housing body, and the center section of the first busbar is arranged in the housing body, the second side being different than the first side,
wherein the first end section of the second busbar projects out of the housing body on the first side of the housing body, the second end section of the second busbar projects out of the housing body on the second side of the housing body, and the center section of the second busbar is arranged in the housing body,
wherein the first end section, the second end section and the center section of the first busbar are arranged in a first plane,
wherein the first end section, the second end section and the center section of the second busbar are arranged in a second plane, which is different than the first plane,
wherein the first end sections of the first and second busbars are located with respect to one another such that the first connection of the first busbar and the first connection of the second busbar are not oriented so as to align with one another, and
wherein the second end sections of the first and second busbars are located with respect to one another such that the second connection of the first busbar and the second connection of the second busbar are not oriented so as to align with one another.

2. The filter component according to claim 1, wherein the first and second busbars are each designed as a flat conductor.

3. The filter component according to claim 2,
wherein the first connection of the first busbar is designed as a depression in the first end section of the first busbar,
wherein the first connection of the second busbar is designed as a depression in the first end section of the second busbar,
wherein the second connection of the first busbar is designed as a depression in the second end section of the first busbar, and
wherein the second connection of the second busbar is designed as a depression in the second end section of the second busbar.

4. The filter component according to claim 1,
wherein the first connection of the first busbar comprises a first fastening device for fastening the first end section of the first busbar to a first electrical conductor that provides the first potential,
wherein the second connection of the first busbar comprises a second fastening device for fastening the second end section of the first busbar to a second electrical conductor for coupling the second end section of the first busbar to the first load,
wherein the first connection of the second busbar comprises a third fastening device for fastening the first end section of the second busbar to a third electrical conductor that provides the second potential, and
wherein the second connection of the second busbar comprises a fourth fastening device for fastening the second end section of the second busbar to a fourth electrical conductor for coupling the second end section of the second busbar to the second load or to the reference potential.

5. The filter component according to claim 4, wherein at least one of the first and second connections of the first and second busbars comprises a screw thread.

6. The filter component according to claim 1, further comprising a magnetic core arranged in the housing body surrounding the center sections of the first and second busbars.

7. The filter component according to claim 6,
wherein the first busbar is designed such that at least one of the first and second end sections and the center section thereof are insertable into the magnetic core, and
wherein the second busbar is designed such that at least one of the first and second end sections and the center section thereof are insertable into the magnetic core.

8. The filter component according to claim 6, wherein at least one of the first and the second busbars has a plurality of electrical conductors that are arranged in the housing body in a stack arrangement and are surrounded by the magnetic core.

9. The filter component according to claim 1, further comprising a plurality of magnetic cores arranged in the housing body, each magnetic core surrounding the center sections of the first and second busbars.

10. The filter component according to claim 1, further comprising:
a first capacitor coupled between the first busbar and the reference potential; and
a second capacitor coupled between the second busbar and the reference potential.

11. The filter component according to claim 1, further comprising a capacitor coupled between the first busbar and the second busbar.

12. The filter component according to claim 1, wherein the second busbar comprises a plurality of conductors.

13. The filter component according to claim 12, wherein the first busbar comprises a plurality of conductors.

14. The filter component according to claim 1,
wherein one of the first and second end sections of the first busbar in the first plane is oriented in a different direction from the center section of the first busbar, and wherein one of the first and second end sections of the second busbar in the second plane is oriented in a different direction from the center section of the second busbar.

15. The filter component according to claim 14, wherein the one of the first and second end sections of the first busbar is arranged at an angle of between 80° and 100° with respect to the center section of the first busbar, and
wherein the one of the first and second end sections of the second busbar is arranged at an angle of between 80° and 100° with respect to the center section of the second busbar.

16. The filter component according to claim 15, wherein the other one of the first and second end sections of the first busbar in the first plane is oriented in the same direction as the center section of the first busbar, and
wherein the other one of the first and second end sections of the second busbar in the second plane is oriented in the same direction as the center section of the second busbar.

17. The filter component according to claim 14, wherein the first and second busbars are both L-shaped.

* * * * *